United States Patent [19]

Croset et al.

[11] Patent Number: 4,521,951
[45] Date of Patent: Jun. 11, 1985

[54] METHOD OF REDUCTION OF A COMPOUND FORMING A LAYER ON A SUBSTRATE AND THE APPLICATION OF SAID METHOD TO THE FABRICATION OF A FIELD-EFFECT SEMICONDUCTING STRUCTURE

[75] Inventors: Michel Croset; Louis Mercandalli, both of Paris, France

[73] Assignee: Thomson-CSF, Paris, France

[21] Appl. No.: 506,994

[22] Filed: Jun. 23, 1983

[30] Foreign Application Priority Data

Jun. 25, 1982 [FR] France .............................. 82 11215

[51] Int. Cl.$^3$ ...................... H01L 21/20; H01L 21/31
[52] U.S. Cl. .................................. 29/571; 29/570; 204/192 SP; 204/192 S; 204/192 D; 252/62.3 GA; 427/87
[58] Field of Search .................... 29/571, 570; 427/38, 427/39, 87; 252/62.3 GA; 204/192 R, 192 SP, 192 S, 192 D; 429/191

[56] References Cited

U.S. PATENT DOCUMENTS 3,522,103  7/1970  White et al. ........................... 419/19
3,532,627  10/1970  Mitoff et al. ........................ 252/62.2
3,943,014  3/1976  Yoshizawa ........................... 148/187
4,218,527  8/1980  Mellors ............................... 429/191
4,362,793  12/1982  Bittihn et al. ........................ 429/191

FOREIGN PATENT DOCUMENTS 1513897  1/1968  France .

OTHER PUBLICATIONS

Kordesch, Karl, Editor, *Batteries, vol. 2 Lead–Acid Batteries and Electric Vehicles,* Marcel Dekker, Inc., New York, 1977, pp. 5, 56–57, 90–92.
Applied Physics Letters, vol. 38, No. 11, Jun. 1981, New York, R. P. H. Chang et al., "Hydrogen Plasma Etching of GaAs Oxide", pp. 898–899.

*Primary Examiner*—Brian E. Hearn
*Assistant Examiner*—Alan E. Schiavelli
*Attorney, Agent, or Firm*—Oblon, Fisher, Spivak, McClelland & Maier

[57] ABSTRACT

The method of reduction comprises two successive steps. The first step consists in forming an electrolyte layer at the surface of the layer to be reduced which is an oxidized surface layer of a substrate. During the second step, the layer is reduced through the layer of electrolyte which is an ionic conductor for the ionizing species. The second step is carried out in a first variant by thermal reduction in a reducing atmosphere and in a second variant by exposure to a reducing plasma.

18 Claims, 15 Drawing Figures

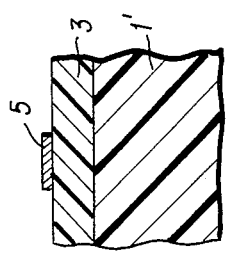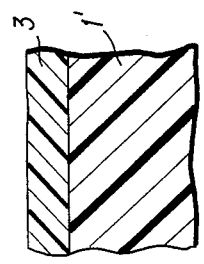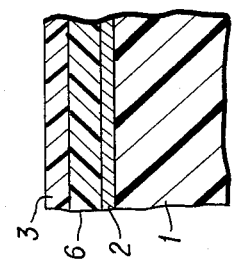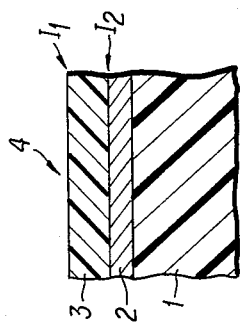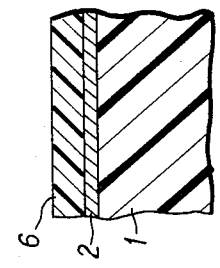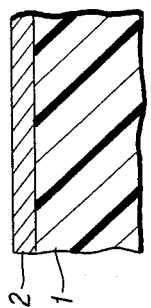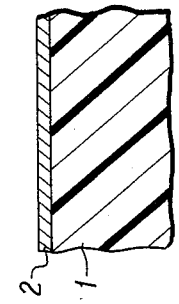

METHOD OF REDUCTION OF A COMPOUND FORMING A LAYER ON A SUBSTRATE AND THE APPLICATION OF SAID METHOD TO THE FABRICATION OF A FIELD-EFFECT SEMICONDUCTING STRUCTURE

BACKGROUND OF THE INVENTION

This invention relates to a method of reduction of compounds forming on a substrate at least one surface layer such as, for example, the oxide layer which is capable of forming spontaneously at the surface of a substrate and is applicable in particular to the fabrication of field-effect semiconducting structures of the type designated as MIS (metal-insulator-semiconductor).

It is known that a cleaved metal or semiconductor surface subjected to chemical, ionic or thermal attack is covered with a thin film of oxide and possibly of other adsorbed chemical species in a very short time of the order of a few seconds after treatment. The thickness of the film-layer thus formed is smaller than one hundred Angströms.

This phenomenon is not without drawbacks in the techniques adopted in microelectronics or submicroelectronics and more generally in all techniques involving the formation of thin films. The result is in fact seen in deep modifications of physico-chemical, optical and/or electronic properties of the surface of such films.

One particularly significant example illustrating the extent of this phenomenon is provided by recent techniques in which gallium arsenide substrates are employed for the development of high-performance integrated circuits, especially those comprising MOS, MIS or other similar types of elements. These devices make it necessary to form dielectric, semiconductor and/or metal layers. In this type of integrated circuit, there exists a relationship between the ratio of oxygen coverage of the substrate surface and the surface curvature of the associated band diagram, which consequently establishes the Fermi level in the surface regions approximately at the center of the forbidden band. The properties of the material are therefore not wholly retained up to the surface, thereby adversely affecting the operation of most devices which are formed on these substrates.

In order to overcome the disadvantages recalled in the foregoing, one solution would consist in cleaning the surface of the substrate and in performing all the successive operations of fabrication of these devices within a vessel in which is maintained a very low pressure commonly known as "ultra-high" vacuum (a pressure of less than $10^{-11}$ Pa approximately).

In addition to the very high costs and the complexity of application associated with this type of technique which preclude its use as an operational industrial process, there in any case exists a potential danger of subsequent contamination of the surface at the time of return to normal atmospheric conditions.

SUMMARY OF THE INVENTION

A method of treatment which does not call for the use of high-vacuum techniques consequently meets a real need and is accordingly the object of the present invention.

The invention is therefore directed to a method of reduction of at least one layer of oxidized compound by a predetermined species which covers all or part of the surface of a substrate, comprising:

a first step during which a layer of a solid electrolyte which is an electronic conductor and an ionic conductor for the predetermined species aforesaid is so arranged as to cover the surface of the substrate in a uniform manner;

and a second step during which said reduction is carried out through the layer of solid electrolyte.

The invention is also directed to a method of fabrication of an MIS field-effect semiconducting structure which involves the steps of the method of reduction.

BRIEF DESCRIPTION OF THE DRAWINGS

Other features of the invention will be more apparent upon consideration of the following description and accompanying drawings, wherein:

FIGS. 2 to 5 illustrate the fabrication of an MIS structure comprising the steps which are specific to the method in accordance with the invention;

FIGS. 8 to 15 relate to a number of alternative forms of application of the method in accordance with the invention.

DETAILED DESCRIPTION OF THE INVENTION

In accordance with a basic feature of the method of reduction contemplated by the invention, this method involves two principal steps. A preliminary step consists in covering the surface of a substrate having a surface layer of a compound to be reduced with a layer of solid dielectric material, the characteristics of which will hereinafter be stated in detail. A second step consists in reducing the compound through the layer.

The basic mechanisms employed will first be explained with reference to FIG. 1.

By way of non-limitative illustration of the method, it is postulated in an initial phase that the compound to be reduced is at least one oxide of the material composing a substrate which is, for example, a semiconducting material such as gallium arsenide.

Figure 1:
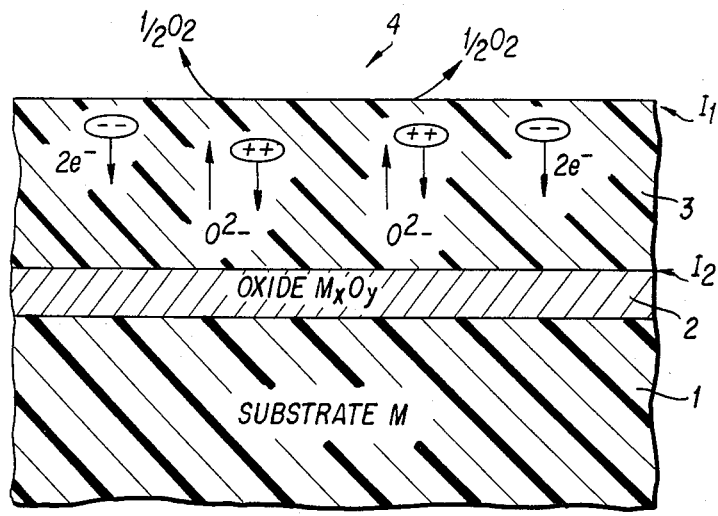
FIG. 1 is a schematic illustration of the physical phenomena which are applied within the scope of the method in accordance with the invention.

FIG. 1 illustrates schematically a substrate 1 of material M covered with a layer of at least one oxide $M_xO_y$ of said material (if a number of oxides exist) and with the dielectric layer 3 which is formed during the first step and covers the oxide layer 2. There therefore exist two interfaces: the interface $I_1$ between the external medium 4 and the dielectric layer 3 and the interface $I_2$ between said layer and the oxide layer 2.

The dielectric material chosen is an ionic conductor which is exclusive of the $O^{2-}$ oxygen ion. The dielectric layer is intended to remain after the treatment performed during the second step of the method, either as a dielectric membrane or as a passivating screen, thus preventing any recontamination of the surface of the substrate 1.

In order to carry out the second step during which effective reduction is achieved, it is possible to select in a first alternative embodiment a technique of heat treatment in a reducing atmosphere.

To this end, the substrate covered with its oxide layer and with the layer of dielectric material in accordance with the method of the invention is placed within a vessel into which is introduced a reducing gas mixture, at least one of the elements of which is an oxygen compound.

By way of example, the mixture of hydrogen and water vapor ($H_2/H_2O$) can be employed within the scope of the invention. Other mixtures which are also suitable include the mixture of carbon monoxide and carbon dioxide ($CO/CO_2$).

The following reversible reaction takes place in the external medium 4:

$$H_2O \rightleftharpoons H_2 + \tfrac{1}{2} O_2 \qquad (1)$$

Partial pressures and especially the partial pressure of oxygen $P_{O2}$ associated with said reaction can be defined. The partial pressures of the different species which take part in a chemical reaction carried out between two gases which are assumed to be ideal and in respect of monothermal changes of state at constant external pressure can be determined from the laws of thermodynamics and are related to each other by the variation in standard free enthalpy $\Delta G_T°$.

At equilibrium, temperature and partial pressure are related to the standard free enthalpy by the expression:

$$RT\ \mathrm{Log}\ (P_{O2}) = \Delta G_T° \qquad (2)$$

Within the scope of the example chosen, the following relation is satisfied at equilibrium:

$$RT\ \mathrm{Log}\ (P_{O2}) = \Delta G_T° + RT\ \mathrm{Log}\ [(P_{H2O})^2/(P_{H2})^2] \qquad (2a)$$

where:
R is the ideal gas constant (8.314 J/[mole. °K.])
T is the temperature in degrees Kelvin
($P_{H2O}$) is the partial pressure of the water vapor
($P_{H2}$) is the partial pressure of the hydrogen.

From a knowledge of the temperature T and the respective proportions of carbon monoxide and carbon dioxide, it is possible to determine the partial pressure of oxygen $P_{O2}$ as a function of the free enthalpy.

There takes place in the oxide layer the reversible reaction of the type:

$$M_xO_y \rightleftharpoons xM + (y/2)\ O_2 \qquad (3)$$

where x and y are numbers which depend on the respective valence numbers of the species M constituting the substrate 1 and of the oxygen (valence 2).

By means of a similar method, it is possible to determine the partial pressure of oxygen $P'_{O2}$ at the interface $I_2$; this pressure also depends on the standard free enthalpy, the only difference being that the concentrations of the solid elements no longer play any part. The partial pressure of oxygen $P'_{O2}$ satisfies the relation at equilibrium:

$$RT\ \mathrm{Log}\ (P'_{O2}) = \Delta G_T° \qquad (4)$$

In accordance with the invention, the "partial oxygen pressure-temperature" pair must be chosen so as to obtain simultaneously a reduction of the oxide layer and an oxidation of the solid electrolyte layer. There therefore exists a possible range for this pair which will hereinafter be given a more precise definition.

These conditions ensure not-negligible electronic and ionic conductions within the solid electrolyte 3.

By way of example, the solid electrolyte (as will be described hereinafter) can be zirconia stabilized by calcium oxide ($Z_rO_2 + CaO$). A temperature of the order of 500° C. is sufficient to satisfy the requirement mentioned earlier.

Under these conditions, and as illustrated in FIG. 1, oxygen vacancies are created at the surface and result in $++$ positive charges.

In fact, the following reaction takes place at the interface $I_1$:

$$O^{2-} - 2e^- \rightarrow \tfrac{1}{2}\overline{O_2} \qquad (5)$$

which is a reaction involving oxidation of the $O^{2-}$ ion with simultaneous release of electrons and oxygen. If the stability of the oxide to be reduced (layer 2) is lower than that of the solid electrolyte, the following reaction takes place at the interface $I_2$:

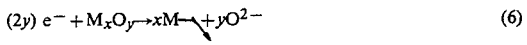
$$(2y)\ e^- + M_xO_y \rightarrow xM + yO^{2-} \qquad (6)$$

The electrons result from transport, by electronic conduction within the solid electrolyte, of the electrons released at the interface $I_1$. Similarly, the released oxygen ions pass through the electrolyte layer as a result of ionic conduction. There is therefore an ambipolar motion of the charged species through the solid electrolyte membrane 3.

If the treatment time is sufficiently long, there is a complete reduction of the oxide layer $M_x O_y$ and replacement of this latter by a layer of the same nature as the substrate 1 if, as has been postulated, the substrate material is identical with the oxidized material.

In a subsequent step, the assembly is restored to normal conditions of pressure and temperature and again placed in free air. The electrolyte layer 3 then performs the function of a passivating screen which prevents any subsequent recontamination of the reduced substrate, in accordance with the objective set by the invention.

To sum up, effective reduction entails the need to ensure that the following relations between the temperature of the vessel T and the partial pressure of oxygen $P_{O2}$ are satisfied simultaneously:

$$P_{RO} > P_{O2} > P_{OE} \qquad (7)$$

and $$T_{RO} > T > T_{OE} \qquad (8);$$

the temperature-pressure pairs being determined from formula (2) and T being necessarily lower than $T_{DO}$, and where:

$P_{RO}$: is the maximum partial pressure at which there is a reduction of the oxide layer;

$P_{OE}$: is the minimum partial pressure at which oxidation of the electrolyte layer takes place;

$T_{DO}$: is the temperature below which destruction of the oxide layer takes place or, if there are several oxides, the lowest temperature which gives rise to destruction of at least one of these oxides;

$T_{RO}$: is the maximum temperature at which reduction of the oxide layer occurs;

$T_{OE}$: is the minimum temperature at which oxidation of the electrolyte layer occurs.

All these relations define a range within which reduction can take place.

Furthermore, and for practical reasons, this set of relations can be completed by the following set:

$$P_{O_2} > P_{PG} \quad (9)$$

$P_{PG}$ being the minimum partial pressure which can be obtained by means of a given gas purification system;

$$P_{O_2} \lesssim 1 \text{ atm} \quad (10)$$

since it is desired to work at atmospheric pressure (98,066.5 Pa)

$$T > T_{TI}, \quad (11)$$

$T_{TI}$ being the minimum temperature at which the time required for reduction is equal to a predetermined time interval which must be reasonably short for the method to have practical applications.

The method in accordance with the invention will now be described in greater detail in connection with the fabrication of semiconducting structures which are known as MIS (an abbreviation designating a metal-insulator-semiconductor stack) and are field-effect devices. The invention is more especially directed to MIS structures on a gallium arsenide substrate.

The fabrication process under consideration is in fact one example of application to which the method in accordance with the invention is particularly well-suited.

Gallium arsenide (GaAs) is a source of very acute and specific difficulties in spite of the advantage which it otherwise offers for the design of high-performance electronic circuits.

A particular example of a structure of this type is the native-oxide MOS structure (metal-oxide-semiconductor structure).

Irrespective of the methods of oxidation adopted, stoichiometry of the oxide is not readily achieved especially in the regions located near the interface. In fact, at the interface between the surface oxide layer provided in this type of device and the gallium arsenide substrate, there takes place a spontaneous formation of a composite intermediate layer of small thickness which is typically 40 Angströms. This layer is formed of arsenic and gallium oxide. This is due to the fact that the arsenic oxide is very unstable. The chemical reaction takes place in accordance with the relation:

$$As_2O_3 + 2GaAs \rightarrow Ga_2O_3 + 4As \quad (12)$$

Finally the arsenic formed is highly volatile. A consequence of this phenomenon is the formation of donor and acceptor traps within the forbidden band, thereby giving rise to hysteresis phenomena, to frequency dispersions and to correlative degradation of performances of electronic circuits fabricated from these structures.

In the prior art, dielectrics other than native oxide have been used with a view to minimizing interface stresses. Among these alternative dielectrics can be mentioned by way of example silicon nitride ($Si_3N_4$), alumina ($Al_2O_3$), aluminum nitride (AlN), silicon dioxide ($SiO_2$) or germanium nitride ($Ge_3N_4$). As before, the difficulty again lies in the need to remove all traces of natural oxide. It is accordingly found mandatory to resort once again to ultra-high vacuum techniques.

The method in accordance with the invention makes it possible to dispense with this requirement. In addition, the dielectric deposited on the substrate during the initial step constitutes an element which performs two functions at the same time: the dielectric-layer function proper, and the function of encapsulant which has the effect of preventing exodiffusion of the arsenic and subsequent formation of a trace of nascent oxide.

FIGS. 2 to 5 illustrate the principal steps of fabrication of an MIS structure which integrate the specific steps of the method in accordance with the invention.

There is shown in FIG. 2 a gallium arsenide substrate 1 which has previously been prepared and cleaned by any suitable techniques not within the scope of the invention. Said substrate is covered spontaneously with a surface layer 2 which comprises gallium oxide ($Ga_2O_3$), arsenic oxide ($As_2O_3$) and arsenic in accordance with the mechanism recalled in the foregoing.

During the first step which is specific to the method in accordance with the invention, a dielectric layer 3 is deposited on this assembly as shown in FIG. 3.

Preferentially, the basic material chosen is zirconia stabilized by calcium oxide ($ZrO_2 + CaO$) in respective atomic proportions of 85% and 15%. This material is a good ionic conductor for oxygen at temperatures higher than or equal to 500° C. It constitutes a good encapsulant for gallium arsenide up to temperatures of the order of 850° C., thus making it possible to prevent exodiffusion of the arsenic. This material also has a coefficient of expansion which is close to gallium arsenide, thus permitting deposits on large substrate surfaces without any attendant danger of crack formation or detachment. Finally, since the endothermic energies of formation of this dielectric are of a high order, this material is consequently stable even at high temperature and cannot be reduced during the second step of the method at the same time as the oxide layer 2. A further result is that, once the oxide layer has been reduced during the second step of the method, the interface between the dielectric layer 3 and the substrate 1' is an interface in which the As and Ga atoms released during the reduction process have returned to a crystallographic position in accordance with the subjacent monocrystalline lattice.

The deposited electrolyte layer 3 has a minimum thickness of the order of a few hundred Angströms so as to ensure a structure without holes and having a maximum thickness of a few thousand Angströms, the limit being fixed by matching of the linear coefficients of expansion between the zirconia and the subjacent layers. Typical thicknesses are within the range of 1000 to 2500 Angströms.

Deposition of the electrolyte layer can be performed by any suitable methods in the field of thin films and preferentially by the technique known as radio-frequency cathodic sputtering.

In more general terms, the choice of the nature of the electrolyte depends on the crystallographic properties of the substrate or of the subjacent layer.

The device as shown in FIG. 3 is then placed as before within a vessel in which is established a controlled reducing atmosphere such as, for example, a mixture of hydrogen ($H_2$) and water vapor ($H_2O$), the proportion of water vapor being typically of the order of 0.5 p.p.m. In the case of small-scale production, the vessel can consist of a laboratory test tube. The vessel is heated to a temperature which is typically of the order of 500° C.

At this temperature, there exists a broad range of partial pressures of oxygen ($10^{-55}$ Pa $< P_{O2} < 10^{-15}$ Pa) which has a reducing action on the arsenic and gallium oxides and an oxidizing action on the zirconia layer. When using the mixture of hydrogen and water vapor in the proportions indicated, the partial pressure of oxygen $P_{O2}$ is of the order of $10^{-35}$ Pa, which is within the range mentioned above.

In the gas mixture, the chemical reactions satisfy relation (1).

In the layer of oxides, relation (3) is subdivided into two elementary relations:

$$4/3 As + O_2 \rightleftharpoons As(4/3)O_2 \tag{3a}$$

$$4/3 Ga + O_2 \rightleftharpoons Ga(4/3)O_2 \tag{3b}$$

The partial pressure of oxygen $P'_{O2}$ can be defined on the basis of these elementary relations and satisfies relation (4).

At the interface $I_1$, relation (5) is again satisfied and, at the interface $I_2$, relation (6) is also subdivided into two elementary relations:

$$12e^- + 2As_2O_3 \rightarrow 4As + 6O^{2-} \tag{6a}$$

$$12e^- + 2Ga_2O_3 \rightarrow 4Ga + 6O^{2-} \tag{6b}$$

Figure 6:
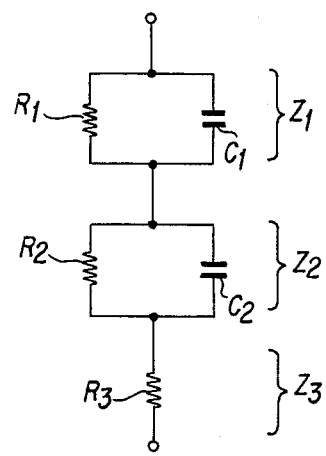
FIG. 6 is an electrical diagram equivalent to a device comprising a substrate which is oxidized at the surface and covered with a layer of solid electrolyte.

In order to take into account on the one hand the electron conductivity and on the other hand the ion conductivity, an electrical model as illustrated in FIG. 6 and equivalent to the structure shown in FIG. 3 can be defined experimentally in the form of a dipole consisting of three impedances in series: the impedance $Z_1$, comprising in parallel a resistor $R_1$ and a capacitor $C_1$, which represents the impedance of the interface $I_1$; the impedance $Z_2$, comprising a resistor $R_2$ and a capacitor $C_2$, which represents the impedance of the doped zirconia layer 3; and the impedance $Z_3$ which is limited to a resistor $R_3$ representing the impedance of the layer of oxides 2.

The experimental data show that it is essentially the impedance $Z_1$ which limits the conduction and that the assembly can be assimilated over a sufficiently long interval (static regime) per unit area (cm$^2$) with an equivalent resistance which is of the order of $1.6 \cdot 10^5$ Ω cm$^2$, taking into account the numerical values mentioned above and especially the treatment temperature (500° C.).

In the case of a substrate area of 1 cm$^2$ and an oxide layer 2 having a thickness of 50 Angstroms, it is necessary to remove $2.2 \times 10^6$ atoms of oxygen, which represents a charge of $7 \times 10^{-3}$ C.cm$^{-2}$ in order to obtain the desired reduction. Under these conditions, the reduction step must last 1050 seconds or approximately 18 mins. The structure to be reduced must therefore be maintained within the vessel under the above-mentioned conditions of partial pressure of oxygen and temperature during a period of time at least equal to 18 mins and more generally a period of time calculated in a similar manner for specific numerical values other than those chosen by way of example.

There is therefore obtained at the end of the second step of the method in accordance with the invention the structure shown in FIG. 4 or in other words a substrate 1' from which its oxide layer has been removed and on which is placed a layer 3 of doped zirconia.

The final step involved in the fabrication of an MIS structure does not strictly come within the purview of the invention. It consists in depositing metal zones 5 of gold, for example, in a predetermined configuration. This step does not differ from the prior art except for the fact that the layer of dielectric required for an MIS structure is now formed by the layer 3 of zirconia which is doped by calcium oxide and also serves as encapsulant in accordance with an advantageous aspect of the invention as recalled earlier.

As in the general case and within the field of application just described, a utilizable range can be defined for the reduction process. This range is delimited by the following data:

The maximum temperature is approximately 800° C. This temperature corresponds to destruction of the oxide which has the lowest temperature stability, namely arsenic oxide (As$_2$O$_3$).

The oxide which is the most difficult to reduce is gallium oxide: relation (6b).

Oxidation of zirconia is carried out in accordance with the relation:

$$Zr + O_2 \rightarrow ZrO_2 \tag{13}$$

Figure 7:
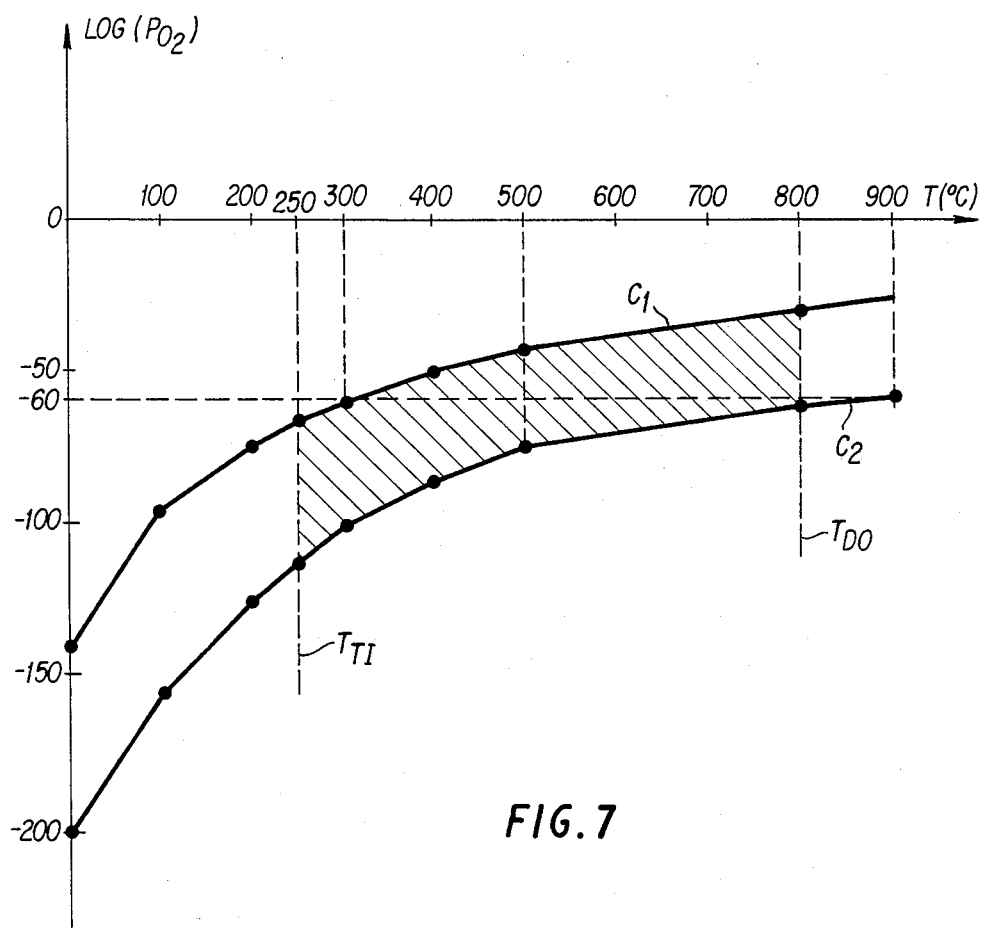
FIG. 7 is a diagram illustrating the range of utilization of the method within the scope of a particular example.

A calculation of the free enthalpy $\Delta G_T°$ (relation 2) therefore permits definition of the limiting curves plotted in the diagram of FIG. 7, namely curve $C_1$ representing the variation of the logarithm of the partial pressure expressed in atmospheres (1 atm = 98,066.5 Pa) as a function of the temperature in °C. associated with relation (6b), and curve $C_2$ associated with relation (13).

The absolute upper limit of the temperature range is set by the temperature of destruction of arsenic oxide (800° C.) and, in practice, by the minimum temperature $T_{TI}$ at which the treatment temperature remains acceptable. Using the numerical data given earlier, $T_{TI} = 250°$ C., which corresponds to a treatment time of 10 hrs.

In the diagram of FIG. 7, the range is shown as a hatched area.

By way of examples which are illustrated in the diagram of FIG. 7: at constant temperature, T = 500° C., the range of feasible partial pressures of oxygen is the one already mentioned ($10^{-55}$ Pa at $10^{-15}$ Pa) whereas, at a constant pressure corresponding to Log ($P_{O2}$) = −60, the maximum temperature which limits the range is not the temperature $T_{RO}$ but the temperature of destruction of arsenic oxide, that is to say 800° C. ($T_{RO}$ being of the order of 900° C.).

Thus far, it has been postulated that the reduction process during the second step of the method took place in a first alternative embodiment by means of a technique involving reduction in a reducing atmosphere at atmospheric pressure.

In a second alternative embodiment, the reduction process can be carried out by exposure to a reducing gas plasma.

To this end, the device to be reduced and provided with the electrolyte layer deposited during the first step is placed within a vessel in which is created a plasma such as hydrogen, for example. This plasma can be either a so-called R.F. (radio-frequency) plasma or a so-called continuous plasma.

The equipment employed for this process is well-known to those who are versed in the art. One example of an equipment unit of this type is described in Pat. No. FR-B-2 394 173. In the first case, the electric power required for supplying the unit is typically 100 W at a frequency f = 60 MHz. In the second case (continuous plasma), the power is typically 1 W. The pressure of the vessel is typically within the range of $10^{-6}$ to $10^{-4}$ Pa.

Preference should be given to the use of a plasma which ensures that the device to be reduced is heated as little as possible in order to retain the specific advantage of plasma reduction, that is to say "cold reduction".

The method in accordance with the invention can be extended to other applications.

Generally speaking, any layer of natural oxide or of oxide formed from the substrate can be reduced irrespective of the subsequent use of the substrate.

Figure 8:
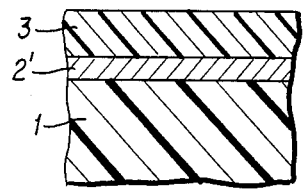
Figure 9:
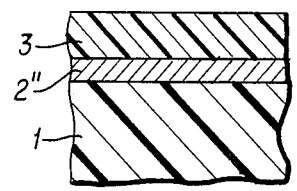

In another alternative embodiment illustrated in FIGS. 8 and 9, the nature of the oxidized material can be different from that of the substrate.

FIG. 8 illustrates a substrate 1 of a first material M1, an oxide layer 2' to be reduced to oxide of a second material M2 and a layer 3 of dielectric such as, for example, zirconia doped by calcium oxide ($ZrO_2+CaO$), this layer being deposited during the first step of the method.

After completion of the second step of the method, the structure appears in the form illustrated in FIG. 9: a substrate 1 of material M1, a layer 2" of material M2 and the dielectric layer 3. This alternative embodiment is particularly advantageous if the material M2 is a metal. There is then obtained a buried conductive strip.

Figure 10:
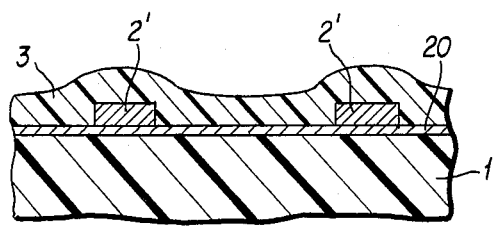
Figure 11:
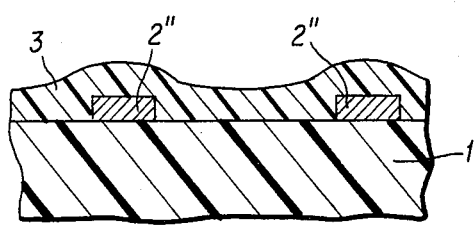

In an additional alternative embodiment illustrated in FIGS. 10 and 11, the oxide layer can be discontinuous. This is the case, for example, with a network of lead interconnections in an integrated electronic circuit.

As illustrated in FIG. 10, a substrate on which there has been placed a network of conductive interconnection strips 2' constituted by a metal which has been subjected to natural oxidation as a result of the phenomenon recalled earlier is covered with a dielectric layer 3 over its entire surface during the first step of the method.

On completion of the second step as illustrated in FIG. 10, the strips 2" are reduced. The substrate can also be initially covered with an oxide layer 20 (as shown in FIG. 10) which will be reduced in the manner described earlier and which will also disappear (as shown in FIG. 11).

So far as the substrate is concerned, it can be formed by a semiconducting material as described in the foregoing, by a solid metal on which a native oxide to be reduced is formed at the surface, or by an oxide forming a dielectric to be reduced to a predetermined depth which is essentially dependent on the treatment time of the second step, all other parameters being fixed.

The method in accordance with the invention can also be profitably employed in the techniques involving solid-phase epitaxy. This application will be described with reference to FIGS. 12 to 15.

FIG. 12 represents a substrate 1 of a first semiconducting material such as gallium arsenide, for example, the surface of which is covered spontaneously with a layer of oxides 2 in accordance with the mechanism described earlier.

As shown in FIG. 13, a layer of oxides 6 of a second semiconducting material such as, for example, gallium oxides is deposited on said substrate up to a predetermined thickness.

In accordance with the first step of the method contemplated by the invention, the assembly as shown in FIG. 14 is covered with a layer 3 of solid electrolyte consisting preferably of zirconia stabilized by calcium oxide ($ZrO_2+CaO$).

The next operation consists in carrying out the second step of the method and simultaneous reduction of the oxide layers 2 and 6 is achieved. It can then be observed that the gallium and antimony species have experienced a rearrangement of the epitaxial type so as to form a layer 6' of gallium antimonide (FIG. 15) derived from the layer 6 (FIG. 14) of oxides of the same species on the substrate 1' (FIG. 15) from which its own layer of oxides 2 has been removed (FIGS. 12 to 14).

The process is not limited to a single layer. By means of this method, it is therefore possible to obtain an epitaxial stack of semiconductor layers of different types and thicknesses which may be completed if necessary by layers of interconnecting systems or of electrodes obtained in the manner described with reference to FIGS. 10 and 11.

Finally, the method in accordance with the invention is more generally applicable to the reduction of compounds other than oxides. Compounds of this type can include the nitrides, one example of which consists of silicon nitride. The reduction reaction conforms to the relation:

$$Si_3N_4 \rightarrow 3Si + 2N_2 \qquad (14)$$

Reduction is obtained from a transfer of the $N^{3-}$ ion through a solid electrolyte which is deposited on the substrate during the first step. One example of electrolyte is provided by ammonium $\beta$-alumina. In the case of the example mentioned above, this substrate is of semiconductor material or at least carries a layer of silicon. All other types of substrates may also be contemplated as before.

Relations (7) and (8) can be re-written in a more general form:

$$P_R > P_{esp} > P_O \qquad (7a)$$

$$T_D > T_R > T > T_O \qquad (8a)$$

where the indices R and O relate as before to reduction of the compound and to oxidation of the solid electrolyte; the index D relates to the temperature of destruction of the compounds (if there are several compounds) and the index "esp" relates to the oxidizing species, namely nitrogen in the example described.

Throughout the foregoing description, the thicknesses of the substrates, although not strictly limited, are usually within the following ranges:
semiconductor substrate: 100 to 500 micrometers
metal or dielectric substrate: smaller than or equal to 2 mm.

The native oxide layers have a thickness below 100 Angströms and the oxide layers formed, for example, of gallium arsenide oxides have a thickness of the order of 300 Angströms.

The invention is not limited to the examples of application which have been specifically described but is applicable whenever it is desired to reduce a layer of a compound or a number of layers placed on a subjacent substrate. However, the invention is particularly advantageous when making use of at least one of the following characteristics:

(a) the substrate is unstable at the treatment temperature, in which case the solid electrolyte acts as an ion conductor and as an encapsulant, thus preventing decomposition of the substrate.

(b) the substrate is monocrystalline; the reduced species are capable of epitaxial rearrangement on the substrate.

(c) the substrate reacts in free air and oxidizes spontaneously; the electrolyte then has a passivating action on the reduced surface.

What is claimed is:

1. A method of fabricating a semiconducting structure comprising reducing at least one layer of oxidized compound containing a predetermined chemical species, which layer covers at least part of the surface of a semiconducting substrate, said reduction being conducted in a first step comprising covering the surface of said substrate with a layer of a solid electrolyte which is an ionic conductor for said predetermined chemical species, followed by a second step comprising carrying out said reduction through said layer of solid electrolyte.

2. A method according to claim 1 wherein, during the first step, the material constituting the solid electrolyte is uniformly deposited on the surface of the substrate by cathodic sputtering in order to form said layer of solid electrolyte.

3. A method according to claim 1 wherein, during the second step, the substrate covered with at least one layer of oxidized compound is exposed through said solid electrolyte layer to a reducing plasma.

4. A method according to claim 3, wherein the reducing plasma is a radio-frequency hydrogen plasma.

5. A method according to claim 1, wherein said predetermined species is oxygen.

6. A method according to claim 5, wherein the substrate is of gallium arsenide and the compound to be reduced comprises gallium and arsenic oxides.

7. A method according to claim 6, wherein the gas mixture is heated to a temperature of 500° C. and comprises hydrogen and water vapor in a proportion equal to 0.5 p.p.m. in order to produce a partial pressure of oxygen equal to $10^{-35}$ Pa.

8. A method according to claim 5, wherein the solid electrolyte layer is of zirconia stabilized by calcium oxide in respective atomic proportions of 85% and 15% and the thickness of the layer is within the range of 1000 Angströms to 2500 Angströms.

9. A method according to claim 5, wherein the compound to be reduced consists of material which is different from the material constituting said substrate.

10. A method according to claim 9 wherein, during the second step, the substrate covered with at least one layer of oxidized compound containing said species is exposed through said solid electrolyte layer to a reducing atmosphere composed of a gas mixture which comprises at least said predetermined chemical species, and satisfies simultaneously the following relations:

$P_R > P_{esp} > P_O;$ $T_R > T > T_O;$ $T_D > T;$ where:

$P_R$ and $T_R$ are respectively the maximum partial pressure of the predetermined species and the maximum temperature at which reduction of each oxidized compound takes place;

$P_{esp}$ and $T$ are respectively the partial pressure of the predetermined species in said gas mixture and the temperature of said mixture;

$P_O$ and $T_O$ are respectively the minimum partial pressure of the predetermined species and the minimum temperature at which oxidation of the electrolyte layer takes place;

$T_D$ is the lowest temperature of destruction of at least one oxidized compound.

11. A method according to claim 5, wherein the substrate is of gallium arsenide and the compound to be reduced comprises a first layer of oxides of gallium and arsenic and a second surface layer of oxides of material which is different from the substrate material.

12. A method according to claim 11, wherein the second surface layer consists of oxides of gallium antimonide.

13. A method according to claim 5, wherein the compound to be reduced comprises a metal oxide.

14. A method according to claim 13, wherein the metal oxide covers the surface of the substrate in a uniform manner.

15. A method according to claim 13, wherein the metal oxide is constituted by an interconnection network which covers predetermined regions of the substrate surface.

16. A method according to claim 1, wherein said predetermined species is nitrogen.

17. A method according to claim 16, wherein the compound to be reduced is silicon nitride and the solid electrolyte is ammonium β-alumina.

18. A method of fabrication of a field-effect semiconducting structure of the MIS type comprising the steps of the method of reduction according to claim 1, including an additional step carried out after the second step of the method of reduction and consisting in deposition of a metal zone which covers predetermined regions of the surface of the solid electrolyte layer in order to form a stack of at least one layer of reduced semiconductor, a dielectric layer formed by the solid electrolyte layer and a metal layer, said stack constituting the MIS structure.

* * * * *